(12) United States Patent
Ney

(10) Patent No.: US 11,346,687 B2
(45) Date of Patent: May 31, 2022

(54) HORIZONTAL MAGNET FOR HALL EFFECT SENSOR ACTIVATION IN A VEHICLE LATCH

(71) Applicant: Inteva Products, LLC, Troy, MI (US)

(72) Inventor: Daniel Alexander Ney, Lake Orion, MI (US)

(73) Assignee: INTEVA PRODUCTS, LLC, Troy, MI (US)

(*) Notice: Subject to any disclaimer, the term of this patent is extended or adjusted under 35 U.S.C. 154(b) by 103 days.

(21) Appl. No.: 16/852,447

(22) Filed: Apr. 18, 2020

(65) Prior Publication Data

US 2020/0333167 A1   Oct. 22, 2020

Related U.S. Application Data

(60) Provisional application No. 62/836,388, filed on Apr. 19, 2019.

(51) Int. Cl.
| | | |
|---|---|---|
| *G01D 5/14* | (2006.01) | |
| *G01R 33/07* | (2006.01) | |
| *H01L 43/06* | (2006.01) | |
| *H01L 43/04* | (2006.01) | |

(52) U.S. Cl.
CPC ............ *G01D 5/145* (2013.01); *G01R 33/072* (2013.01); *H01L 43/04* (2013.01); *H01L 43/06* (2013.01)

(58) Field of Classification Search
CPC ........ G01R 1/00; H05K 1/00; H05K 2201/00; G06F 1/00
See application file for complete search history.

(56) References Cited

U.S. PATENT DOCUMENTS

| 5,890,384 | A | 4/1999 | Bartel et al. | |
|---|---|---|---|---|
| 8,154,404 | B2 | 4/2012 | Diener et al. | |
| 10,112,578 | B2 | 10/2018 | Lehmeier et al. | |
| 2004/0226767 | A1* | 11/2004 | Martinez | B60R 21/01546 180/268 |
| 2009/0128267 | A1* | 5/2009 | Mozer | B60K 37/06 335/205 |
| 2010/0127807 | A1* | 5/2010 | Hammond | H01F 7/1615 335/255 |

(Continued)

FOREIGN PATENT DOCUMENTS

| FR | 2755174 B1 | 9/2001 |
|---|---|---|
| JP | 2010250576 A | 11/2010 |
| WO | 2019032298 A1 | 2/2019 |

OTHER PUBLICATIONS

International Search Report for Application No. PCT/US2020/028884; dated Jul. 30, 2020.

(Continued)

*Primary Examiner* — Jermele M Hollington
*Assistant Examiner* — Temilade S Rhodes-Vivour
(74) *Attorney, Agent, or Firm* — Cantor Colburn LLP

(57) ABSTRACT

A latching system with a hall-effect sensor as described herein. A vehicle latch, including: a component movably secured to the latch; a magnet secured to the component; and a hall effect sensor positioned to detect a polarity of the magnet as the component moves, wherein the magnet is arranged with respect to the hall effect sensor so that a direction of the magnet's polarity (North and South) is parallel to the hall effect sensor as the component moves with respect to the hall effect sensor.

12 Claims, 5 Drawing Sheets

(56) References Cited

U.S. PATENT DOCUMENTS

| | | | |
|---|---|---|---|
| 2012/0218018 A1* | 8/2012 | Petrie | G01R 33/0029 |
| | | | 327/187 |
| 2014/0100687 A1* | 4/2014 | Ekstrom | B25C 1/00 |
| | | | 700/160 |
| 2014/0184200 A1* | 7/2014 | Milano | G01R 33/072 |
| | | | 324/202 |

OTHER PUBLICATIONS

Written Opinion for Application No. PCT/US2020/028884; dated Jul. 30, 2020.
International Preliminary Report on Patentablity for International Application No. PCT/US2020/028884; International Filing Date: Apr. 18, 2020; Date of Report: Sep. 28, 2021; 4 pages.

* cited by examiner

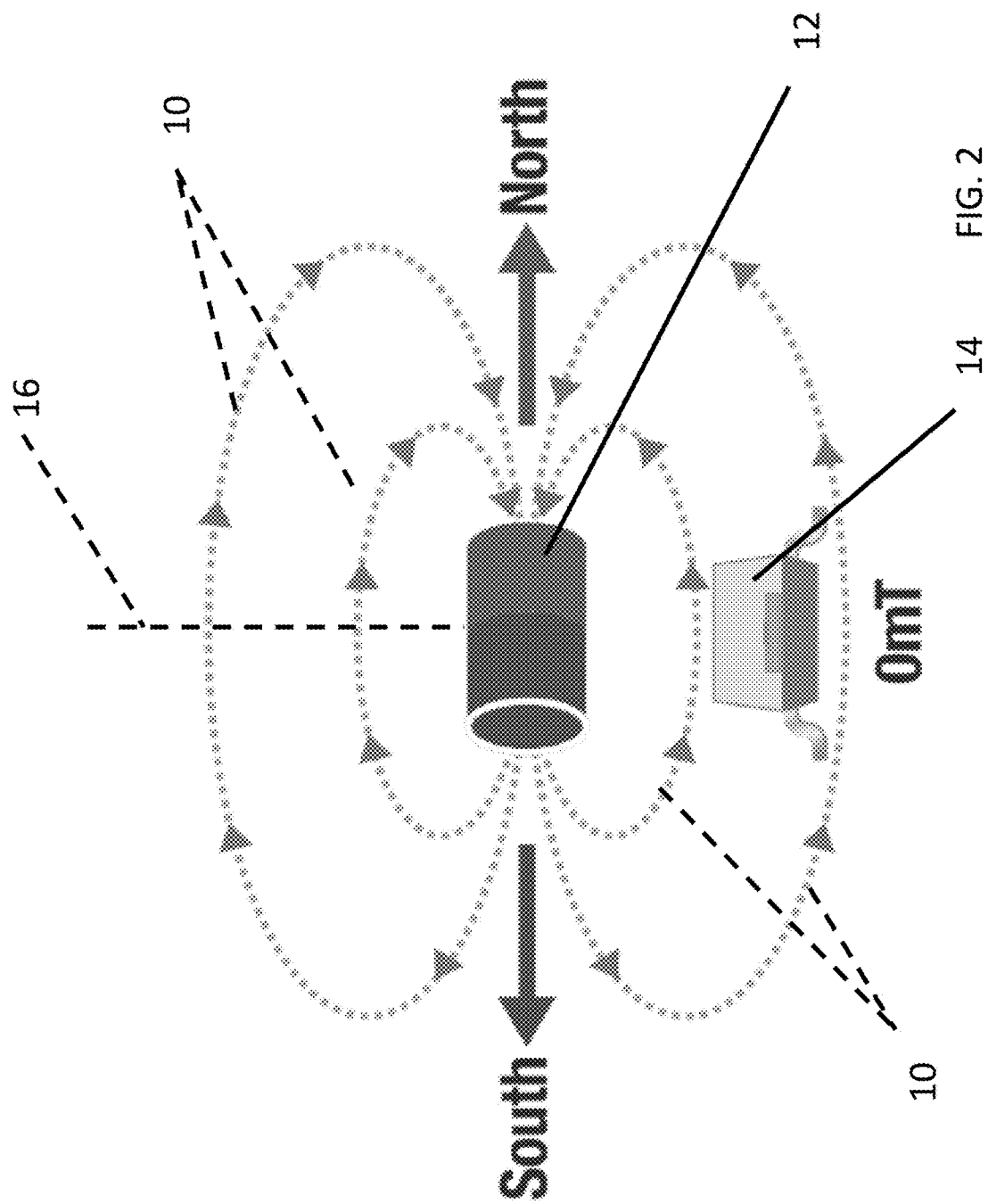

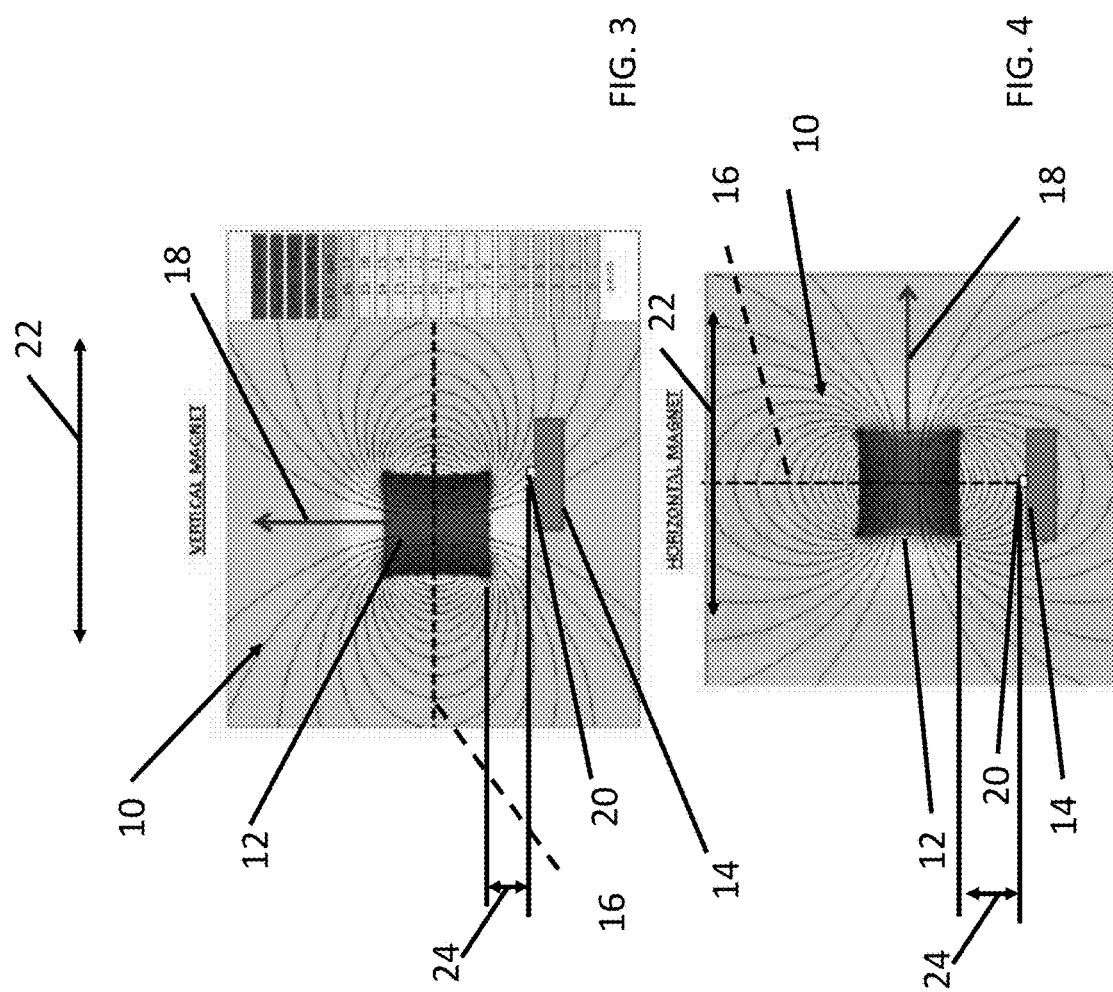

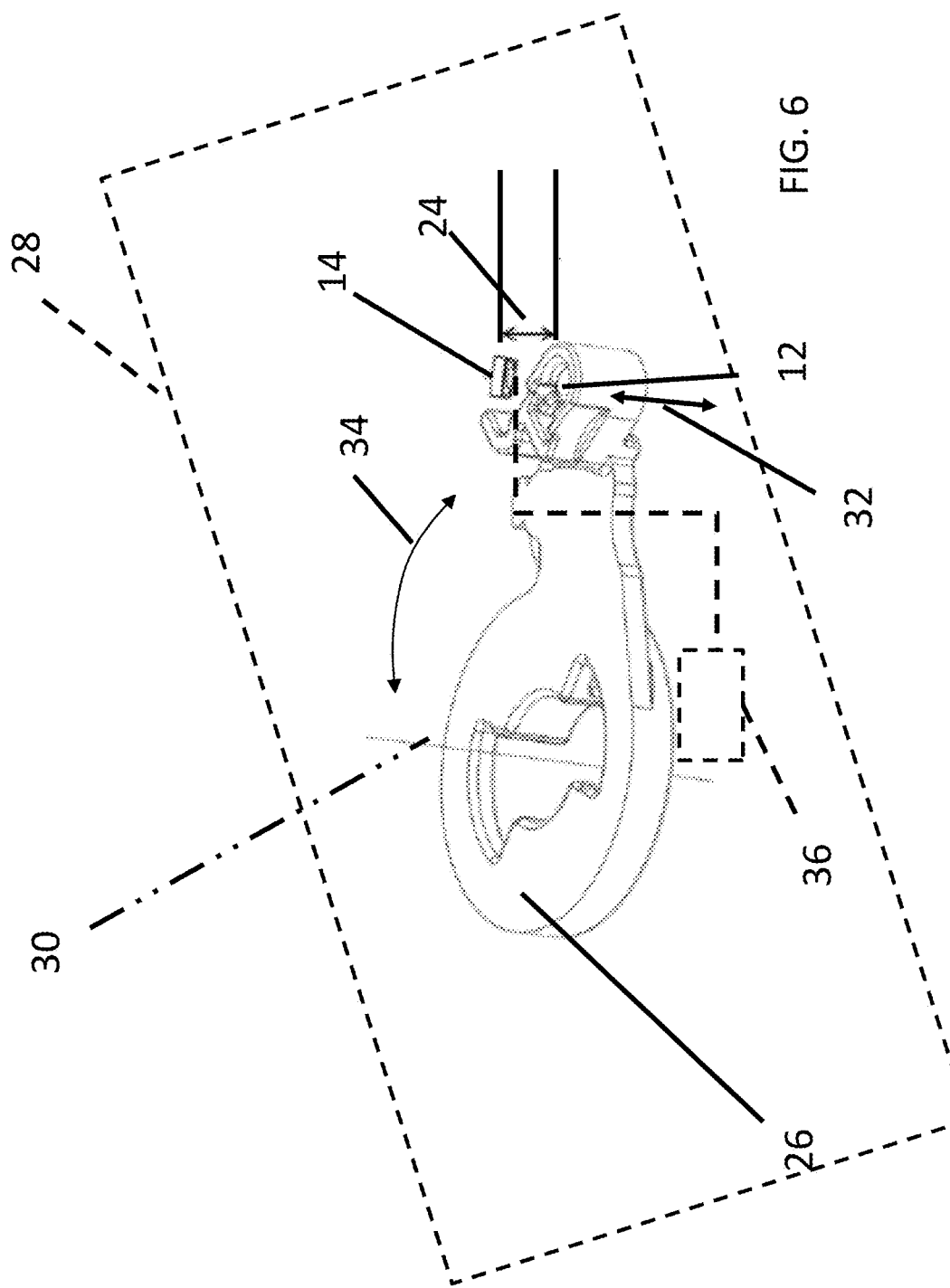

HORIZONTAL MAGNET FOR HALL EFFECT SENSOR ACTIVATION IN A VEHICLE LATCH

CROSS REFERENCE TO RELATED APPLICATIONS

This application claims priority to the following U.S. Provisional Patent Application Ser. No. 62/836,388 filed on Apr. 19, 2019 the contents of which are incorporated herein by reference thereto.

BACKGROUND

Exemplary embodiments of the present disclosure pertain to the hall-effect sensor and their use in vehicle latches.

Hall-effect sensors are becoming increasingly popular in latching systems. A hall-effect sensor is activated depending on the magnetic field strength that is reads. For latching applications, it is imperative that the controller knows the position of the components inside the latch accurately. Using a traditional hall effect arrangement, the magnet is positioned with its polarity perpendicular to the sensor. Since the magnetic field strength is not consistent at different air gap sizes (the perpendicular distance between the magnet and sensor), the magnet may activate at different horizontal positions based on the present air gap. This means that extra tight tolerances must be held in these zones, and that the sensor will not be directly over the position where it needs to be activated, but instead at the offset position, where the proper magnetic field strength is, which further makes development and tolerances difficult to design.

BRIEF DESCRIPTION

A latching system with a hall-effect sensor.

Also disclosed is a vehicle latch, including: a component movably secured to the latch; a magnet secured to the component; and a hall effect sensor positioned to detect a polarity of the magnet as the component moves, wherein the magnet is arranged with respect to the hall effect sensor so that a direction of the magnet's polarity (North and South) is parallel to the hall effect sensor as the component moves with respect to the hall effect sensor.

In addition to one or more of the features described above, or as an alternative to any of the foregoing embodiments, the component is rotatably secured to the vehicle latch for rotation about an axis.

In addition to one or more of the features described above, or as an alternative to any of the foregoing embodiments, an air gap is provided between the hall effect sensor and the magnet.

In addition to one or more of the features described above, or as an alternative to any of the foregoing embodiments, the hall effect sensor is configured to provide signals indicative of the magnet's polarity to a printed circuit board.

In addition to one or more of the features described above, or as an alternative to any of the foregoing embodiments, the component is rotatably secured to the vehicle latch for rotation about an axis.

In addition to one or more of the features described above, or as an alternative to any of the foregoing embodiments, an air gap is provided between the hall effect sensor and the magnet.

Also disclosed is a method of detecting movement of a component of a vehicle latch, including: movably securing the component to the latch; securing a magnet to the component; and detecting a polarity of the magnet with a hall effect sensor as the component moves, wherein the magnet is arranged with respect to the hall effect sensor so that a direction of the magnet's polarity (North and South) is parallel to the hall effect sensor as the component moves with respect to the hall effect sensor.

In addition to one or more of the features described above, or as an alternative to any of the foregoing embodiments, the component is rotatably secured to the vehicle latch for rotation about an axis.

In addition to one or more of the features described above, or as an alternative to any of the foregoing embodiments, an air gap is provided between the hall effect sensor and the magnet.

In addition to one or more of the features described above, or as an alternative to any of the foregoing embodiments, further including providing signals indicative of the magnet's polarity to a printed circuit board.

In addition to one or more of the features described above, or as an alternative to any of the foregoing embodiments, the component is rotatably secured to the vehicle latch for rotation about an axis.

In addition to one or more of the features described above, or as an alternative to any of the foregoing embodiments, an air gap is provided between the hall effect sensor and the magnet.

BRIEF DESCRIPTION OF THE DRAWINGS

The following descriptions should not be considered limiting in any way. With reference to the accompanying drawings, like elements are numbered alike:

The attached FIGS. illustrate various views of a hall-effect sensing system for use in a latching system.

FIGS. 2-4 illustrates a magnetic field of a magnet and a hall-effect sensor;

FIG. 6 is a perspective view of a rotatable or moveable component of a latch whose movement is to be sensed.

DETAILED DESCRIPTION

A detailed description of one or more embodiments of the disclosed apparatus and method are presented herein by way of exemplification and not limitation with reference to the Figures.

The disclosure described herein allows for an accurate horizontal position determination of a magnet using a hall-effect sensor. Most current hall-effect and magnet systems rely on strictly the magnetic field strength to activate a sensor, however, this concept utilizing the polarity of the magnet as well to better locate position.

Trying to determine the field strength of a magnet in comparison to its coordinate position away from the sensor is difficult and requires advanced engineering software, and tight tolerances for the position. This concept helps to minimize the effects of this problem by turning the magnet sideways, so that the polarity of the magnet is parallel with the movement of the magnet and component. The hall-effect sensor is designed to only look for one polarity of the magnet, either North or South, and then detects a minimum magnetic field strength value that has that polarity. By turning the magnet horizontal, the sensor's magnet field strength reading can be reduced to a minimal value, and the system can rely on the change in polarity to detect position.

This allows for several advantages. Changes in air gap will have a minimal effect on the system, due to relying on polarity change more than magnetic field strength. Since the polarity changes at the center of the magnet, the sensor positioning can be directly over top of the magnet, as opposed to being offset at a specified distance. This means that from a positioning tolerance stand point, it is a more simplified process to design the location of the hall-effect sensor in comparison with the positioning of the magnet. The specific grade or size of the magnet will make minimal difference in the functionality and accuracy of the system. This opens the system up for design changes, or a variety of magnet selection options, without needing to change the geometry or location of the hall-effect sensor or the magnet positioning.

The concept may be utilized on any latching systems that require a printed circuit board PCB and hall-effect sensors.

Figure 1:
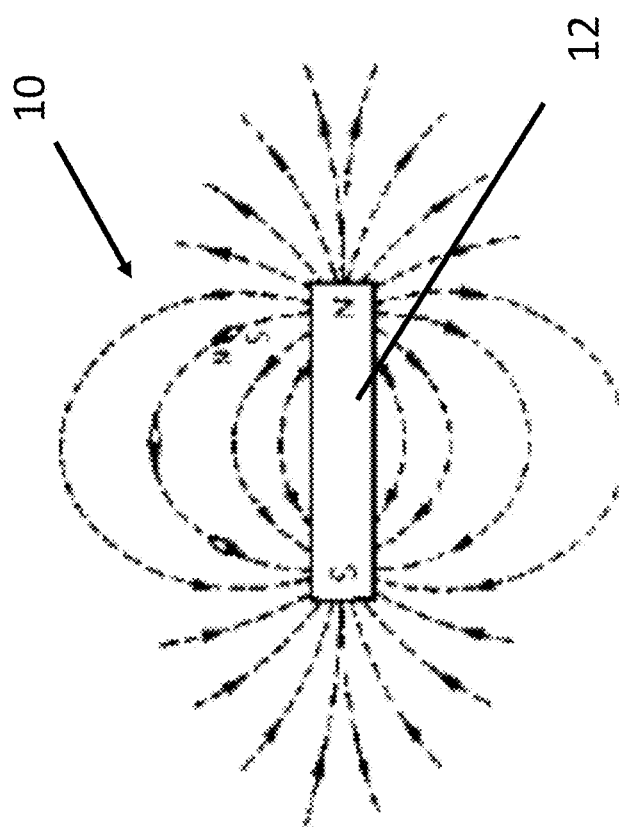
FIG. 1 illustrates a magnetic field of a magnet.

Referring now to FIG. 1 a magnetic field 10 of a magnet 12 is illustrated;

FIGS. 2-4 illustrates a magnetic field 10 of a magnet 12 and a hall-effect sensor 14. Also shown is the change in polarity of the magnet from North to South by dashed line 16. In FIGS. 3 and 4 the North polarity is illustrated by arrow 18 and a sensing point 20 of the hall effect sensor 14 is also illustrated. In FIG. 3 the magnet 12 is vertically arranged with respect to the hall effect sensor 14 or in other words, the North and South poles of the magnet 12 are perpendicular to a direction of travel of the magnet 12 with respect to the hall effect sensor. This direction is illustrated by arrows 22. Also shown in FIG. 3 is the location at which the sensing point 20 of the hall effect sensor 14 will detect the magnetic field 10 of the magnet.

In FIG. 4 the magnet 12 is horizontally arranged with respect to the hall effect sensor 14 or in other words, the North and South poles of the magnet 12 are parallel to a direction of travel of the magnet 12 with respect to the hall effect sensor. This direction is illustrated by arrows 22. Also shown in FIG. 4 is the location at which the sensing point 20 of the hall effect sensor 14 will detect the change in the polarity of the magnet 12 (e.g., North to South and vice versa). What is important to note here is that when the magnet is 12 arranged in this fashion with respect to the hall effect sensor 14 the change in polarity is easily measured or calibrated for and variations in an air gap 24 between the sensing point 20 and the magnet 12 will not adversely affect the sensing point's 20 ability to sense the proximity of the magnet. Moreover and in one embodiment, the air gap 24 in the orientation of FIG. 4 may be a bit larger than that of FIG. 3 without adversely affecting the hall effect sensor's performance.

Figure 5:
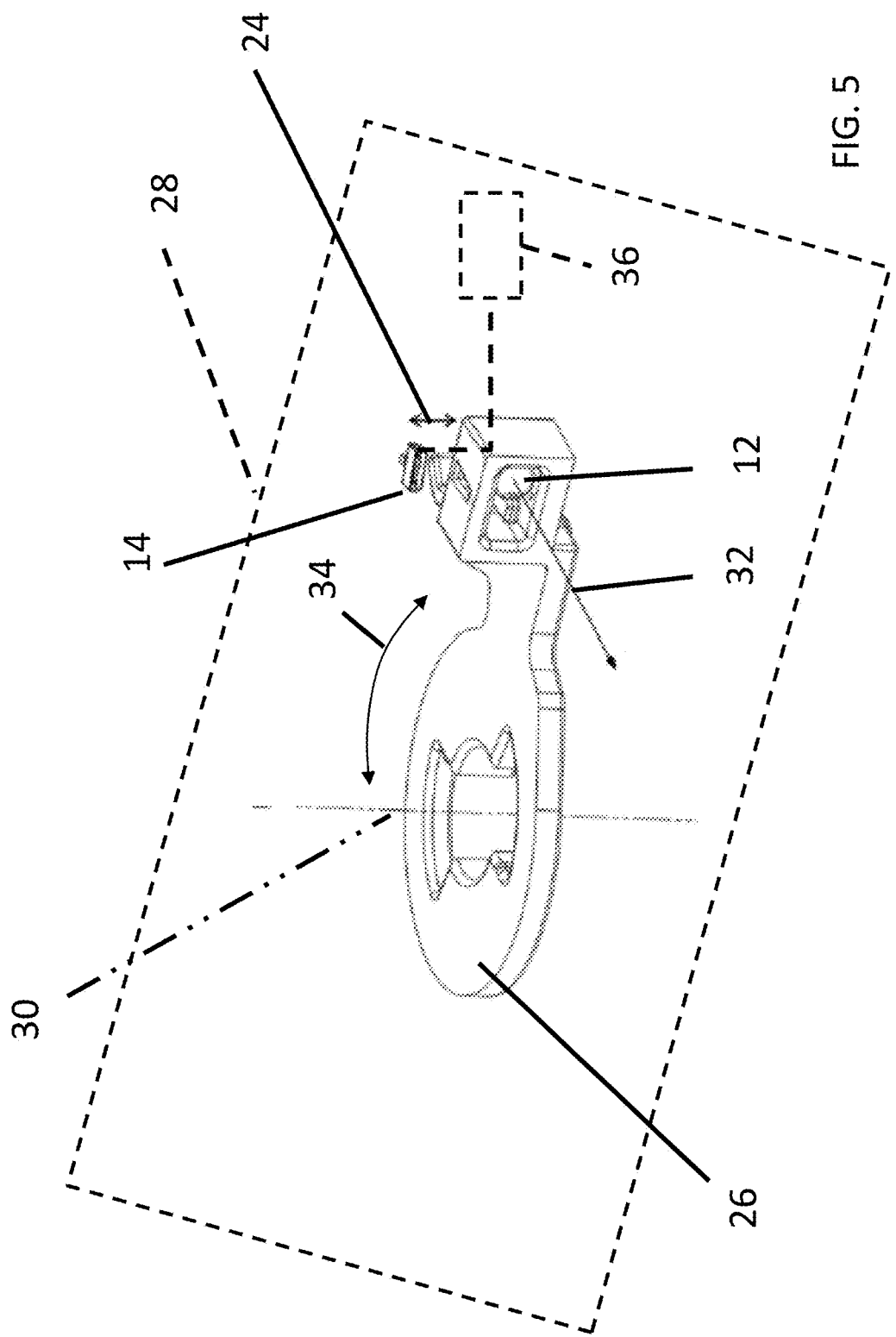
FIG. 5 illustrates a rotatable or moveable component of a latch whose movement is to be sensed.

In FIG. 5 a rotatable or moveable component 26 of a latch (illustrated schematically by dashed lines 28) is provided. In an exemplary embodiment, the latch 28 may be a vehicle door latch or a vehicle latch or a latch associated with a lift gate or tail gate. Here the moveable component 26 is rotatably secured to the latch 28 for movement about an axis 30. As illustrated in FIG. 5 the magnet 12 is secured to the component in a manner that makes it horizontally arranged with respect to the hall effect sensor 14 so that the direction of the magnet's polarity (e.g., North or South) illustrated by arrow 32 is parallel to the hall effect sensor 14 as the component 26 whose movement is to be sensed rotates or moves in the direction of arrow 34. As mentioned above and as discussed with regard to FIGS. 2 and 4, the hall effect sensor 14 detects the change in polarity of the magnet as it moves past the hall effect sensor 14.

In one embodiment, the hall effect sensor 14 is coupled or configured to provide signals indicative of the magnet's polarity to a printed circuit board PCB or PCB assembly 36 (illustrated schematically) that will also have controller(s) or microcontroller(s) or microprocessor(s) (not shown) as well as the necessary electrical traces in order to operate the latch 28.

The PCB may also be referred to as a door latch controller or latch controller or electronic latch controller that comprises a microprocessor, microcontroller or other equivalent processing device capable of executing commands of computer readable data or program for executing a control algorithm that controls the operation of the latch 28. Moreover, the microprocessor, microcontroller or other equivalent processing device is capable of being programmed in order to provide the various control features described herein (e.g., door latch controller or latch controller or electronic latch controller and/or door unit controller).

In order to perform the prescribed functions and desired processing, as well as the computations therefore (e.g., the execution of fourier analysis algorithm(s), the control processes prescribed herein, and the like), the controller may include, but not be limited to, a processor(s), computer(s), memory, storage, register(s), timing, interrupt(s), communication interfaces, and input/output signal interfaces, as well as combinations comprising at least one of the foregoing. For example, the controller may include input signal filtering to enable accurate sampling and conversion or acquisitions of such signals from communications interfaces.

In addition and in other embodiments the PCB or door latch controller or electronic latch controller may also be configured to control other features of a vehicle door to which the latch 28 is secured to. Non-limiting examples of these features include operation of a window regulator, side view mirrors, lighting, etc. As such, the PCB or door latch controller may also be configured to operate as door unit controller.

Since the PCB includes a microprocessor, microcontroller or other equivalent processing device it can be programmed to execute commands of computer readable data or a program for executing a control algorithm that controls the operation of the vehicle latch and/or other components of a vehicle door the latch 28 is secured to. Therefore, the PCB may be configured to serve as a hub for other vehicle door electronics in addition to the operation of the latch 28.

In FIG. 6 a rotatable or moveable component 26 of a latch (illustrated schematically by dashed lines 28) is also provided. In an exemplary embodiment, the latch 28 may be a vehicle door latch or a vehicle latch or a latch associated with a lift gate or tail gate. Here the moveable component 26 is rotatably secured to the latch 28 for movement about an axis 30. As illustrated in FIG. 6 the magnet 12 is secured to the component in a manner that makes it vertically arranged with respect to the hall effect sensor 14 so that the direction of the magnet's polarity (e.g., North or South) illustrated by arrow 32 is perpendicular to the hall effect sensor 14 as the component 26 whose movement is to be sensed rotates or moves in the direction of arrow 34. As mentioned above and as discussed with regard to FIG. 3, the hall effect sensor 14 detects the magnetic field of the magnet 12 as it moves past or towards the hall effect sensor 14. In this configuration, the variations in the air gap 24 will adversely affect the efficiency of the hall effect sensor 14. As mentioned above, the hall effect sensor 14 in one embodiment may be coupled or configured to provide signals indicative of the magnet's magnetic field to a printed circuit board PCB or PCB assembly (not shown) that will also have controller(s) or microcontroller(s) or microprocessor(s) (not shown) as well as the necessary electrical traces in order to operate the latch 28. The terminology used herein is for the purpose of describing particular embodiments only and is not intended to be limiting of the present disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

While the present disclosure has been described with reference to an exemplary embodiment or embodiments, it will be understood by those skilled in the art that various changes may be made and equivalents may be substituted for elements thereof without departing from the scope of the present disclosure. In addition, many modifications may be made to adapt a particular situation or material to the teachings of the present disclosure without departing from the essential scope thereof. Therefore, it is intended that the present disclosure not be limited to the particular embodiment disclosed as the best mode contemplated for carrying out this present disclosure, but that the present disclosure will include all embodiments falling within the scope of the claims.

What is claimed is:

1. A vehicle latch, comprising:
   a component movably secured to the latch;
   a single magnet secured to the component has a north pole at one end and a south pole at an opposite end; and
   a hall effect sensor positioned to detect a polarity of the single magnet as the component moves, wherein the single magnet is arranged with respect to the hall effect sensor so that a direction of the north pole and the south pole is parallel to the hall effect sensor as the component moves with respect to the hall effect sensor.

2. The vehicle latch as in claim 1, wherein the component is rotatably secured to the vehicle latch for rotation about an axis.

3. The vehicle latch as in claim 1, wherein an air gap is provided between the hall effect sensor and the single magnet.

4. The vehicle latch as in claim 1, wherein the hall effect sensor is configured to provide signals indicative of the single magnet's polarity to a printed circuit board.

5. The vehicle latch as in claim 4, wherein the component is rotatably secured to the vehicle latch for rotation about an axis.

6. The vehicle latch as in claim 5, wherein an air gap is provided between the hall effect sensor and the single magnet.

7. A method of detecting movement of a component of a vehicle latch, comprising:
   movably securing the component to the latch;
   securing a single magnet to the component, the single magnet having a north pole at one end and a south pole at an opposite end; and
   detecting a polarity of the single magnet with a hall effect sensor as the component moves, wherein the single magnet is arranged with respect to the hall effect sensor so that a direction of the north pole and the south pole is parallel to the hall effect sensor as the component moves with respect to the hall effect sensor.

8. The method as in claim 7, wherein the component is rotatably secured to the vehicle latch for rotation about an axis.

9. The method as in claim 7, wherein an air gap is provided between the hall effect sensor and the single magnet.

10. The method as in claim 7, further comprising providing signals indicative of the single magnet's polarity to a printed circuit board.

11. The method as in claim 10, wherein the component is rotatably secured to the vehicle latch for rotation about an axis.

12. The method as in claim 11, wherein an air gap is provided between the hall effect sensor and the single magnet.

* * * * *